(12) United States Patent
Miyazaki et al.

(10) Patent No.: US 8,187,788 B2
(45) Date of Patent: May 29, 2012

(54) PHOTOSENSITIVE RESIN COMPOSITION AND PHOTOSENSITIVE FILM

(75) Inventors: Kuon Miyazaki, Tokyo (JP); Takashi Hayakawa, Tokyo (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 653 days.

(21) Appl. No.: 12/226,227

(22) PCT Filed: Apr. 24, 2007

(86) PCT No.: PCT/JP2007/058861
§ 371 (c)(1),
(2), (4) Date: Oct. 10, 2008

(87) PCT Pub. No.: WO2007/125921
PCT Pub. Date: Nov. 8, 2007

(65) Prior Publication Data
US 2009/0191385 A1    Jul. 30, 2009

(30) Foreign Application Priority Data

Apr. 28, 2006 (JP) ................................. 2006-126623
Jul. 27, 2006 (JP) ................................. 2006-205394

(51) Int. Cl.
G03F 7/022 (2006.01)
G03F 7/26 (2006.01)
G03F 7/30 (2006.01)
C08F 2/42 (2006.01)
G03C 1/00 (2006.01)
C08J 3/26 (2006.01)

(52) U.S. Cl. .................. 430/270.1; 430/311; 430/280.1; 430/322; 430/325; 430/326; 430/313; 430/314; 522/74; 522/78; 522/79; 522/151; 522/152; 522/173; 522/176; 522/910; 264/405; 264/477; 264/494; 264/495; 528/271; 528/310; 528/322

(58) Field of Classification Search ............... 430/270.1, 430/283.1, 280.1, 322, 325, 326; 528/322, 528/310, 271; 427/508, 510, 518; 522/74, 522/78, 79, 151, 152, 173, 176, 910; 264/405, 264/477, 494, 495

See application file for complete search history.

(56) References Cited

U.S. PATENT DOCUMENTS

| | | |
|---|---|---|
| 3,957,512 A | 5/1976 | Kleeberg et al. |
| 4,093,461 A | 6/1978 | Loprest et al. |
| 2006/0154176 A1 | 7/2006 | Park et al. |
| 2008/0233513 A1 | 9/2008 | Komatsu et al. |
| 2009/0123867 A1* | 5/2009 | Yuba et al. ............. 430/270.1 |

FOREIGN PATENT DOCUMENTS

| | | |
|---|---|---|
| EP | 0 224 680 A2 | 6/1987 |
| EP | 0 478 321 A1 | 4/1992 |
| JP | 49-115541 | 11/1974 |
| JP | 52-13315 | 2/1977 |
| JP | 62-135824 A | 6/1987 |
| JP | 3064579 B2 | 7/2000 |
| JP | 2002-278061 A | 9/2002 |
| JP | 2003-5369 A | 1/2003 |
| JP | 2006-145901 A | 6/2006 |
| WO | WO-2005/101125 A1 | 10/2005 |
| WO | WO 2007004345 A1 * | 1/2007 |

OTHER PUBLICATIONS

Maekawa et al. Disssolution Inhibitory Effects of a Urea Additive on a Carboxyl Polymer through a Supermolecular Formula. Macromolecules, 2000, 33, 6794-6799.*

* cited by examiner

*Primary Examiner* — Sanza McClendon
(74) *Attorney, Agent, or Firm* — Birch, Stewart, Kolasch & Birch, LLP

(57) ABSTRACT

Disclosed is a photosensitive resin composition comprising an alkali-soluble resin, wherein the dissolution rate of the alkali-soluble resin in an aqueous sodium carbonate solution is not less than 0.04 μm/sec. When a photosensitive layer having a thickness of 30 μm is formed by applying the photosensitive resin composition onto a base and removing the solvent by heating, and thus-obtained photosensitive layer is irradiated with an active ray of 1000 mJ/cm$^2$ or less, the dissolution rate of the portion irradiated with the active ray in the photosensitive layer made of the photosensitive resin composition is not less than 0.22 μm/sec and the film residual rate of the portion not irradiated with the active ray is not less than 90%.

21 Claims, No Drawings

US 8,187,788 B2

PHOTOSENSITIVE RESIN COMPOSITION AND PHOTOSENSITIVE FILM

FIELD OF THE INVENTION

The present invention relates to a photosensitive resin composition and a photosensitive film, and a coverlay using them.

BACKGROUND ART

Polyimide resins have high heat resistance and excellent electrical characteristics, and one major application thereof is a protective film for semiconductor devices and an interlayer dielectric film in multilayer interconnection structures.

Conventionally, the protective film for semiconductor devices and the interlayer dielectric film in multilayer interconnection structures have been formed by using photoresist. Thus, a polyamide acid, a precursor of a polyimide resin, is applied on a substrate, and heated to form a polyimide film. Then, on the surface of the polyimide film, a photoresist film is mounted, and this photoresist film is exposed to light and developed to form a resist pattern. Then using this resist pattern as an anti-etching mask, the selective etching of the base polyimide film is carried out. In this way, a polyimide protective film or an interlayer dielectric film having the desired pattern can be formed.

However, when a resin pattern is formed using the above method, two steps of forming a polyimide film and of forming a resin pattern must be carried out. In order to solve such a problem, polyimides or polyimide precursors having a photosensitive characteristics are being developed.

For example, it has been investigated to obtain a photosensitive composition by blending a polyamide acid comprising an aromatic acid dianhydride and an aromatic diamine with a naphthoquinone diazide compound as a photosensitizer (Japanese Unexamined Patent Publication (Kokai) No. 52-13315). Said photosensitive composition is a positive type in which the UV-irradiated region is dissolved in an alkali developing solution. Thus, a naphthoquinone diazide compound forms an indene carboxylic acid by absorbing a UV ray, thereby enhancing the dissolution rate into the alkali developing solution in the exposed region. On the other hand, non-exposed region not irradiated with a UV ray becomes difficult to dissolve in an alkali developing solution due to the hydrophobicity of the naphthoquinone diazide compound. As a result, due to the difference in solubility of the exposed region and the nonexposed region, a line image can be formed. However, though the nonexposed region cannot be easily dissolved in an alkali developing solution due to the hydrophobicity of naphthoquinone diazide, it dissolves out due to the high solubility of the polyamide acid, leading to film reduction, and thus a sufficient line image cannot be obtained.

As a method of suppressing film reduction, a method (Japanese Unexamined Patent Publication (Kokai) No. 62-135824) has been devised in which a part of the carboxyl groups of a polyamide acid is neutralized with a strong base triethylamine, and the coated film is heated to imidize 10-20% of the polyamide acid thereby to suppress the dissolution of the nonexposed region. However, in this method, the control of imidization with an amine compound is difficult, and a line image cannot be obtained in a reproducible manner. Furthermore, it has a problem of low storage stability of varnish. Also, this requires the use of an aqueous potassium hydroxide solution after developing, and thus developing with an aqueous sodium carbonate solution which is a recent demand is difficult.

Furthermore, it has been investigated to blend a photosensitive composition comprising a polyimide precursor, a naphthoquinone diazide compound, with a basic nitrogen-containing compound of which base dissociation constant (pKb) at 25° C. is 7 or greater (Japanese Unexamined Patent Publication (Kokai) No. 2003-5369). This method intends to suppress the solubility of the UV-nonirradiated portion by neutralizing a part of the carboxyl group borne by the polyimide precursor. However, even with this method, when an amine basic compound is to be blended, there is a problem of deteriorating the storage stability of varnish. Also, since imidation gradually proceeds in the heating step such as the desolvation step and the lamination step, a line image cannot be obtained in a reproducible manner.

Efforts are being made to reduce the solubility into the alkali developing solution by esterifying the carboxyl group of a polyamide acid with a photopolymerizable group. For example, a photopolymerizable group has been introduced by an ester bond with the carboxyl group in the synthetic process of a polyamide acid to obtain a negative type photosensitive resin composition (Japanese Unexamined Patent Publication (Kokai) No. 49-115541). However, the synthesis of the above photosensitive resin composition involves a number of steps, and is troublesome. Also, since an organic solvent is used in the developing solution, the exposed portion may also swell by the organic solvent, and thus a sufficient line image may not be obtained.

In recent years, a film-type print-circuit board called a flexible printed circuit board (hereinafter referred to as FPC) is drawing much attention. FPC is has mainly been used in mobile phones, laptop personal computers, digital cameras and the like. Since FPC remains active even when it is bent, it is an indispensable material for miniaturized and light-weighted devices. Specifically in recent years, miniaturized and light-weighted devices are gaining popularity, and accordingly FPC is contributing to reduced dimension and reduced weight of the above devices, reduced production cost, simplified designing etc.

As a coverlay material for FPC, an adhesive-attached polyimide film has been used in terms of bending resistance, thermal resistance and electric insulating properties. However, when the polyimide film is to be used, there are problems in the precision of position adjustment and cost since it is stuck and punched by the human hand.

Thus, various methods are being devised that form a polyimide in which after a photosensitive property is imparted to a polyimide precursor and a wiring pattern is formed, the polyimide precursor is heated to form the polyimide (for example, U.S. Pat. No. 3,064,579, Japanese Unexamined Patent Publication (Kokai) No. 2002-278061). However, when these polyimide precursors are to be imidated, temperature as high as 300° C. or more is required. Thus, for applications that do not tolerate high temperature, for example a coverlay material provided to FPC for use in electronic devices, the method cannot be applied.

DISCLOSURE OF THE INVENTION

In order to solve the above problems, it is an object of the present invention to provide a photosensitive resin composition that is easy to manufacture, that has no warping of the photosensitive film, that can be laminated at a low temperature of 100° C. or less, that has a large difference in solubility of the exposed portion and the unexposed portion into an alkali developing solution, the film residual rate of the unexposed portion after development is 90% or higher, that can be developed in an aqueous sodium carbonate solution, and that can be cured at a low temperature heating at 200° C. or less, and a photosensitive film, a resin pattern, and a coverlay that employ the above photosensitive resin composition.

After intensive and extensive research, the present inventors have resolved the above problems by using a photosensitive resin composition comprising an alkali-soluble resin, and by controlling the dissolution rate of the alkali-soluble resin and the dissolution rate of the photosensitive layer comprising the photosensitive resin composition.

Thus, the object of the present invention can be attained by the following constitution. The photosensitive resin composition of the present invention is a photosensitive resin composition comprising an alkali-soluble resin, and is characterized in that: the dissolution rate of said alkali-soluble resin in an aqueous sodium carbonate solution is 0.04 µm/sec or higher; when an active ray of 1000 mJ/cm$^2$ or less is irradiated to a photosensitive layer with a film thickness of 30 µm obtained after the application of said photosensitive resin composition on the substrate and desolvation by heating, the dissolution rate of the portion irradiated with the active ray in the photosensitive layer made of the photosensitive resin composition is 0.22 µm/sec or higher; and the film residual rate of the portion not irradiated with the active ray is 90% or more.

In the photosensitive resin composition of the present invention, the Tg of the above photosensitive layer may preferably be 100° C. or less, and the Tg of a film obtained by heating the above photosensitive layer at 200° C. may preferably be 200° C. or less.

The photosensitive resin composition of the present invention may preferably comprise (A) an alkali-soluble resin, (B) a dissolution suppressing agent, (C) a photosensitizing agent, and (D) an organic solvent (excluding the compound which is identical to the one constituting (B)).

In the photosensitive resin composition of the present invention, (A) an alkali-soluble resin may preferably be a polyimide precursor.

In the photosensitive resin composition of the present invention, the above polyimide precursor may preferably comprise a polyamide acid or a carboxyl group-containing polyamide acid ester represented by formula (1):

[Formula 1]

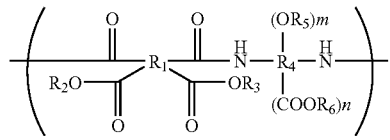

(1)

wherein $R_1$ is a tetra-valent organic group; $R_2$ and $R_3$ are each hydrogen or an organic group having 1-20 carbons, and may be the same or different; $R_4$ is a 2-4 valent organic group; $R_5$ and $R_6$ are each hydrogen or an organic group having 1-20 carbons, and may be the same or different; provided that when each of $R_2$ and $R_3$ is not hydrogen, then $m+n>0$ and $n>0$, $R_5$ is hydrogen or an organic group having 1-20 carbons, and $R_6$ is hydrogen; when at least one of $R_2$ and $R_3$ is hydrogen, $m+n>0$, and $R_5$ and $R_6$ are each hydrogen or an organic group having 1-20 carbons, and may be the same or different.

In the photosensitive resin composition of the present invention, the imidation rate of a film obtained by heating the photosensitive layer at 200° C. or less may preferably be 90% or higher.

In the photosensitive resin composition of the present invention, the elongation rate of a film obtained by heating the photosensitive layer at 200° C. or less may preferably be 5% or higher.

The photosensitive resin composition of the present invention may preferably comprise a combination of structures in which $R_1$ is represented by formula (2) and $R_4$ is represented by formula (4), or a combination of structures in which $R_1$ is represented by formula (2) and $R_4$ is represented by formula (5), or a combination of structures in which $R_1$ is represented by formula (3) and $R_4$ is represented by formula (5) in formula (1).

[Formula 2]

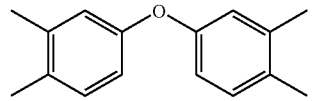

(2)

[Formula 3]

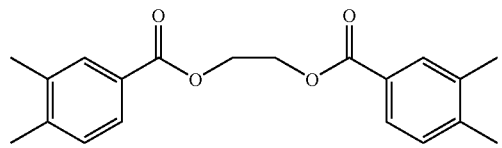

(3)

[Formula 4]

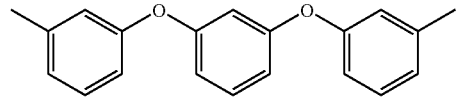

(4)

[Formula 5]

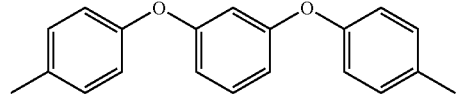

(5)

In the photosensitive resin composition of the present invention, (B) a dissolution suppressing agent may preferably be an amide compound or a urea compound.

In the photosensitive resin composition of the present invention, (B) a dissolution suppressing agent may preferably be an amide compound comprising an aromatic hydroxy group or a urea compound comprising an aromatic hydroxy group.

In the photosensitive resin composition of the present invention, (C) a photosensitizing agent may preferably be a compound that generates an acid by the irradiation of an active ray.

In the photosensitive resin composition of the present invention, (C) a photosensitizing agent may preferably be a quinone diazide compound.

In the photosensitive resin composition of the present invention, (D) an organic solvent may preferably be γ-butyrolactone.

In the photosensitive resin composition of the present invention, (E) a crosslinking agent may preferably be contained.

In the photosensitive resin composition of the present invention, (E) a crosslinking agent may preferably be a tetracarboxylic acid compound, a tetracarboxylic acid ester compound, a polyamide acid compound, or a polyamide acid ester compound represented by formula (6) or formula (7):

[Formula 6]

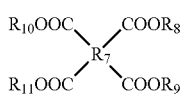
(6)

wherein $R_7$ is a tetra-valent organic group, $R_8$ to $R_{11}$ are hydrogen or an organic group having 1-20 carbons, and may be the same or different,

[Formula 7]

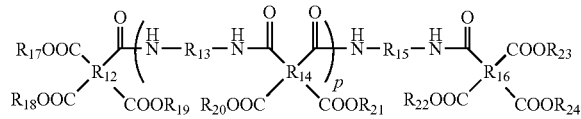
(7)

wherein $R_{12}$, $R_{14}$ and $R_{16}$ are each a tetra-valent organic group, and may be the same or different; $R_{13}$ and $R_{15}$ are a divalent to a tetra-valent organic group, and may be the same or different; $R_{17}$ to $R_{24}$ are hydrogen or an organic group having 1-20 carbons, and may be the same or different; an p is an integer of 0 to 100.

In the photosensitive resin composition of the present invention, (F) a thermal base-generating agent may preferably be contained.

In the photosensitive resin composition of the present invention, (F) a thermal base-generating agent may preferably generate an amine compound.

The photosensitive layer of the present invention is characterized in that it is made of the above photosensitive resin composition.

The photosensitive film of the present invention is characterized in that it comprises a carrier film and the above photosensitive layer formed on said carrier film.

The laminated film of the present invention is characterized in that it comprises a cover film formed on the above photosensitive layer of the above photosensitive film.

One of the methods of forming the resin pattern of the present invention comprises:

an application step which comprises applying the above photosensitive resin composition on the surface of a substrate, a photosensitive layer-forming step which comprises forming a photosensitive layer by heating the above photosensitive resin composition after the above application step, an active ray-irradiation step which comprises irradiating an active ray on the desired region of the above photosensitive layer after the above photosensitive layer-forming step, a resin pattern-forming step which comprises developing the above photosensitive layer using an aqueous alkali solution after the above active ray-irradiation step, a washing step which comprises washing the above resin pattern with a rinse solution after the above resin pattern-forming step, and a curing step which comprises heating the above resin pattern after the above washing step.

Another method of forming the resin pattern of the present invention comprises:

an application step which comprises applying the above photosensitive resin composition on the surface of a substrate, a photosensitive layer-forming step which comprises forming a photosensitive layer by heating the above photosensitive resin composition after the above application step, a laminating step which comprises transferring the above photosensitive layer on the surface of another substrate after the above photosensitive layer-forming step, an active ray-irradiation step which comprises peeling off the substrate used in the above application step from the photosensitive layer after the above laminating step, and then irradiating an active ray on the desired region of the above photosensitive layer, a resin pattern-forming step which comprises developing the above photosensitive layer using an aqueous alkali solution after the above active ray-irradiation step, a washing step which comprises washing the above resin pattern with a rinse solution after the above resin pattern-forming step, and a curing step which comprises heating the above resin pattern after the above washing step.

Another method of forming the resin pattern of the present invention comprises:

a laminating step which comprises transferring the above photosensitive layer of the photosensitive film on the surface of another substrate, an active ray-irradiation step which comprises peeling off the carrier film of the above photosensitive film after the above laminating step, and then irradiating an active ray on the desired region of the above photosensitive layer, a resin pattern-forming step which comprises developing the above photosensitive layer using an aqueous alkali solution after the above active ray-irradiation step, a washing step which comprises washing the above resin pattern with a rinse solution after the above resin pattern-forming step, and a curing step which comprises heating the above resin pattern after the above washing step.

Another method of forming the resin pattern of the present invention comprises:

a laminating step which comprises peeling off one of the cover film or the carrier film of the above laminated film, and then transferring the photosensitive layer on the surface of another substrate, an active ray-irradiation step which comprises peeling off the other of the cover film or the carrier film of the above photosensitive film after the above laminating step, and then irradiating an active ray on the desired region of the above photosensitive layer, a resin pattern-forming step which comprises developing the above photosensitive layer using an aqueous alkali solution after the above active ray-irradiation step, a washing step which comprises washing the above resin pattern with a rinse solution after the above resin pattern-forming step, and a curing step which comprises heating the above resin pattern after the above washing step.

The coverlay of the present invention is characterized in that it is formed by any of the above methods.

The photosensitive resin composition of the present invention may preferably comprise at least (A') a polyamide acid represented by formula (8), (B) a dissolution suppressing agent, (C) a photosensitizing agent, and (D) an organic solvent (excluding the compound which is identical to the one constituting (B)):

[Formula 8]

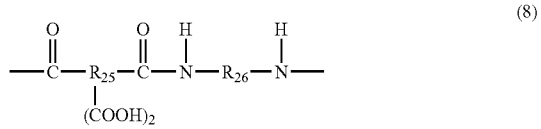

in formula (8), $R_{25}$ represents a tetravalent organic group having two or more carbons, and $R_{26}$ represents a divalent organic group having two or more carbons.

In the photosensitive resin composition of the present invention, (B) a dissolution suppressing agent may preferably be an amide compound or a urea compound.

In the photosensitive resin composition of the present invention, (B) a dissolution suppressing agent may preferably be at least one selected from 3'-hydroxyphenyl acetanilide, 4'-hydroxyphenyl acetanilide, 4-hydroxyphenyl benzamide, and 3-hydroxyphenyl urea.

In the photosensitive resin composition of the present invention, (C) a photosensitizing agent may preferably be a compound that generates an acid by an active ray irradiation.

In the photosensitive resin composition of the present invention, (C) a photosensitizing agent may preferably be a quinone diazide compound.

In the photosensitive resin composition of the present invention, (D) an organic solvent may preferably be γ-butyrolactone.

The photosensitive film of the present invention is characterized in that it comprises a photosensitive resin composition described above.

The coverlay of the present invention is characterized in that it is formed using the above photosensitive film.

The circuit board of the present invention is characterized in that it comprises the above coverlay.

In accordance with the present invention, the production of the photosensitive resin composition is easier than the conventional methods. By using the photosensitive resin composition of the present invention, there can be obtained a photosensitive layer that has no warping, that has a good transferring property in lamination, that has a large solubility difference between the exposed portion and the unexposed portion even when a thick film is exposed by an aqueous sodium carbonate solution, and that has a film residual rate of 90% or more in the unexposed portion. Also, after exposing (developing) the photosensitive layer, the desired resin pattern can be formed by a low temperature heating treatment at 200° C. or less. By using the photosensitive resin composition of the present invention, a photosensitive film, a resin pattern and a coverlay can be obtained.

BEST MODE FOR CARRYING OUT THE INVENTION

The present invention will be specifically explained, hereinbelow.

As used herein, the photosensitive resin composition of the present invention comprises an alkali-soluble resin with a dissolution rate into an aqueous sodium carbonate solution of 0.04 μm/sec or more, and in which when a photosensitive layer with a film thickness of 30 μm obtained after application of the above photosensitive resin composition on a substrate and desolvation by heating is irradiated (exposed) with an active ray of 1000 mJ/cm² or less, the dissolution rate of the active ray irradiated portion of the film made of the above photosensitive resin composition into an aqueous sodium carbonate solution is 0.22 μm/sec or more, and the film residual rate of the active ray nonirradiated portion is 90% or more. As used herein "desolvation" is a drying step carried out after applying the photosensitive resin composition.

(The Dissolution Rate of an Alkali-Soluble Resin into the Aqueous Sodium Carbonate Solution)

As used herein, the dissolution rate of an alkali-soluble resin of the present invention into the aqueous sodium carbonate solution means a dissolution rate of a film comprising an alkali-soluble resin which is a structural component of the photosensitive resin composition into the aqueous sodium carbonate solution.

The dissolution rate of an alkali-soluble resin into the aqueous sodium carbonate solution may be calculated by the following method.

1. The alkali-soluble resin is dissolved in a solvent such as γ-butyrolactone to prepare an alkali-soluble resin varnish. At this time, the concentration is adjusted to 20 wt % to 30 wt %.

2. The above alkali-soluble resin varnish is applied on a copper foil to a film thickness after desolvation of 25 μm to 40 μm using an applicator.

3. Desolvation is carried out with a hot plate or a drier. Desolvation is carried out with a hot plate at 60° C. for 30 minutes, and then with a drier at a condition of 95° C. for 30 minutes.

4. To a 1 wt % aqueous sodium carbonate solution that had previously been warmed to 40° C., a substrate to which a desolvated alkali-soluble resin has been applied is soaked. It is shaken for 10 seconds at a ratio of once every 30 seconds for complete dissolution.

5. The film thickness (μm) after desolvation is divided by the time (sec) of complete dissolution, thereby to obtain the dissolution rate.

The dissolution rate of an alkali-soluble resin obtained by the method described above into sodium carbonate may be 0.04 μm/sec or more and preferably 0.06 μm/sec or more, considering the development time after active ray irradiation.

(The Dissolution Rate and Film Residual Rate of the Photosensitive Layer)

The dissolution rate of the active ray irradiated portion of the photosensitive layer made of the photosensitive resin composition of the present invention into the aqueous sodium carbonate solution and the film residual rate of the active ray nonirradiated portion can be calculated by the following method. For the calculation of the dissolution rate of the photosensitive layer, either the calculation method-1 or the calculation method-2 may be used. As used herein the term "photosensitive layer" refers to a layer made of a photosensitive resin composition obtained after the application of the photosensitive resin composition of the present invention on the substrate followed by desolvation.

(The Calculation Method of the Dissolution Rate of the Photosensitive Layer-1)

1. The photosensitive resin composition of the present invention is applied using an applicator on a polyester film to a film thickness after desolvation of 30 μm.

2. The photosensitive resin coating obtained in 1 is desolvated to form a photosensitive layer. Desolvation is carried out with a hot plate at 60° C. for 30 minutes, and then with a drier at a condition of 95° C. for 20 minutes.

3. A copper-laminated glass epoxy substrate is warmed to 60° C. The above photosensitive layer is transferred to the above substrate using a hot roll laminator (AL-700, manufactured by Asahi Kasei Corporation). After transfer, the polyester film is peeled off from the photosensitive layer. The transfer with a hot roll laminator is carried out at a condition of a temperature of 100° C., a pressure of 0.35 MPa, and a feed speed of 0.5 m/min. The copper-laminated glass epoxy substrate should previously be scrub-polished (abrasive, SAKURUNDUM RF220, Nihon Kensaku Toryu K.K.) by Jet Scribe In (manufactured by ISHII HYOKI SHA).

4. By covering the half of the substrate obtained in 3 with an aluminum foil, and using a mask aligner (MA-10, manufactured by MIKASA) not equipped with a pattern mask, an active ray is irradiated at an exposure amount of 1000 mJ/cm$^2$ (UV350-corrected).

5. The active ray-irradiated substrate is soaked in a 1 wt % aqueous sodium carbonate solution that had previously been warmed to 40° C., and shaken for 10 seconds at a ratio of once every 30 seconds. The time required to complete dissolution is set as the soaking time.

6. The film thickness (μm) of the photosensitive layer before soaking is divided by the soaking time (sec) to obtain the dissolution rate.

(The Calculation Method of the Dissolution Rate of the Photosensitive Layer-2)

1. A photosensitive film or the photosensitive layer of a laminated film is transferred to a copper-laminated glass epoxy substrate that had previously been warmed to 60° C. using a hot roll laminator (AL-700, manufactured by Asahi Kasei Corporation). For the laminated film, after peeling off one of the carrier film or the cover film, then the photosensitive layer is transferred. After transfer, (the other of) the carrier film or the cover film is peeled off. The transfer with the hot roll laminator is carried out under a condition of a temperature of 100° C., a pressure of 0.35 MPa, and a feed speed of 0.5 m/min. The copper-laminated glass epoxy substrate should previously be scrub-polished (abrasive, SAKURUNDUM RF220, Nihon Kensaku Toryu K.K.) by Jet Scribe In (manufactured by ISHII HYOKI SHA).

2. By covering the half of the substrate obtained in 1 with an aluminum foil, and using a mask aligner (MA-10, manufactured by MIKASA) not equipped with a pattern mask, an active ray is irradiated at an exposure amount of 1000 mJ/cm$^2$ (UV350-corrected).

3. The active ray-irradiated substrate is soaked in a 1 wt % aqueous sodium carbonate solution that had previously been warmed to 40° C., and shaken for 10 seconds at a ratio of once every 30 seconds. The time required to complete dissolution is set as the soaking time.

4. The film thickness (μm) of the photosensitive layer before soaking is divided by the soaking time (sec) to obtain the dissolution rate.

(Calculation of the Film Residual Rate)

1. Using the Stylus Profiler (DEKTAK, ULVAC, Inc.), the film residual thickness (μm) is measured.

2. The film residual thickness (μm) obtained in 1 is divided by the film thickness (μm) of the photosensitive layer before soaking, and multiplied by 100 to obtain the film residual rate.

The dissolution rate of the active ray-irradiated portion thus obtained is 0.22 μm/sec or more, considering the time required for the development process and the film residual rate of the active ray-nonirradiated portion. Also, since the desired shape can be obtained for the line image after development, the film residual rate of the active ray-nonirradiated portion is 90% or more.

(A) Alkali-soluble Resin

The alkali-soluble resin (A) for use in the present invention may be any resin having a carboxyl group in the molecular chain. From the viewpoint of the heat resistance of the film obtained after heating at 200° C. or less, a polyimide or a polyimide precursor having a carboxyl group in the molecule (hereinafter referred to as carboxyl group-containing), a polybenzoxazole having a carboxyl group in the molecule (hereinafter referred to as carboxyl group-containing), and a polybenzoxazole precursor having a carboxyl group in the molecule (hereinafter referred to as carboxyl group-containing) are preferred. From the viewpoint of the reduced warp after desolvation, the elongation rate by low-temperature curing, development of flexibility, and development with sodium carbonate, the polyimide precursor is more preferred, and the polyamide acids represented by formula (1), the polyamide acid esters having a carboxyl group in the molecule (hereinafter referred to as carboxyl group-containing) are more preferred:

[Formula 9]

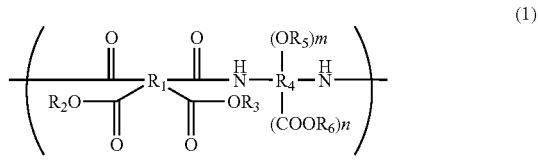

(1)

wherein $R_1$ is a tetra-valent organic group; $R_2$ and $R_3$ are each hydrogen or an organic group having 1-20 carbons, and may be the same or different; $R_4$ is a 2-4 valent organic group; $R_5$ and $R_6$ are each hydrogen or an organic group having 1-20 carbons, and may be the same or different; provided that when each of $R_2$ and $R_3$ is not hydrogen, then m+n>0 and n>0, $R_5$ is hydrogen or an organic group having 1-20 carbons, and $R_6$ is hydrogen; when at least one of $R_2$ and $R_3$ is hydrogen, m+n>0, and $R_5$ and $R_6$ are each hydrogen or an organic group having 1-20 carbons, and may be the same or different.

As the alkali-soluble resin of the present invention, (A') a polyamide acid represented by formula (8) is more preferred:

[Formula 10]

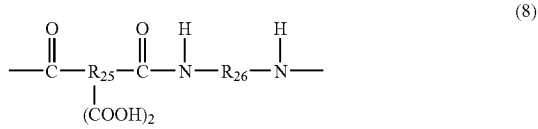

(8)

in formula (8), $R_{25}$ represents a tetra-valent organic group having two or more carbons, and $R_{26}$ represents a divalent organic group having two or more carbons.

The polyimide precursor can be easily synthesized by a known method described in SAISHIN POLYIMIDE: KISOTO OUYOU (Latest Polyimide: Basics and Applications), Japan Polyimide Society, ed., pp. 4-49. Specifically, there can be mentioned a method of reacting tetracarboxylic acid dianhydride and a diamine at a low temperature; a method of reacting a tetracarboxylic acid dianhydride and an alcohol to synthesize a diester, which is then reacted to a diamine in the presence of a condensation agent; a method of reacting a tetracarboxylic acid dianhydride and an alcohol to synthesize a diester, and then after the remaining dicarboxylic acid is converted to oxychloride, it is reacted to a diamine, and the like.

As a tetracarboxylic acid dianhydride for use as a monomer of a polyimide precursor, and a diamine include those described below.

As an aromatic tetracarboxylic acid dianhydride, there can be specifically mentioned pyromellitic acid dianhydride, 3,3', 4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, 3,3'-oxydiphthalic acid dianhydride, 4,4'-oxydiphthalic acid dianhydride, 2,2-bis(4-(4-aminophenoxy)phenyl)propane, 1,3-dihydro -1,3-dioxo-5-isobenzofuran carboxylic acid-1,4-phenylene ester, 4-(2,5-dioxotetrahydrofuran-3-yl)-1,2,3,4-tetrahydronaphthalene-1,2-dicarboxylic acid anhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, 2,2-bis(3,4-dicarboxyphenyl)hexafluoropropane dianhydride, 2,2-bis(4-(3,4-dicarboxyphenoxy)phenyl)hexafluoropropane dianhydride, 2,2-bis(4-(3,4-dicarboxybenzoyloxy)phenyl)hexafluoropropane dianhydride, 2,2'-bis(trifluoromethyl)-4,4'-bis(3,4-dicarboxyphenoxy)biphenyl dianhydride, and the like.

As an aliphatic tetracarboxylic acid dianhydride, there can be mentioned cyclobutanetetracarboxylic acid dianhydride, 1,2,3,4-cyclopentanetetracarboxylic acid dianhydride, 2,3,5,6-cyclohexanetetracarboxylic acid dianhydride, 5-(2,5-dioxotetrahydro-3-furanyl)-3-methyl -3-cyclohexene-1,2-dicarboxylic acid dianhydride, ethyleneglycol-bis-anhydrous trimellitic acid ester, bicyclo[2,2,2]octo-7-ene-2,3,5,6-tetracarboxylic acid dianhydride, 1,2,3,4-butanetetracarboxylic acid dianhydride, and the like. They may be used alone or in combination with two or more of them.

Among them, from the viewpoint of lowering the glass transition temperature (hereinafter referred to as Tg) of the film obtained by heating the photosensitive layer at 200° C. or less, pyromellitic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, 3,3'-oxydiphthalic acid dianhydride, 4,4'-oxydiphthalic acid dianhydride, 2,2-bis(4-(4-aminophenoxy)phenyl)propane, 1,3-dihydro -1,3-dioxo-5-isobenzofuran carboxylic acid-1,4-phenylene ester, and ethyleneglycol-bis-anhydrous trimellitic acid ester are preferred.

As a diamine, there can be specifically mentioned 1,4-diaminobenzene, 1,3-diaminobenzene, 2,4-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 3,7-diamino-dimethylbenzothiophene-5,5-dioxide, 4,4'-diaminobenzophenone, 3,3'-diaminobenzophenone, 4,4'-bis(4-aminophenyl)sulfide, 4,4'-diaminodiphenylsulfone, 4,4'-diaminobenzanilide, 1,n-bis(4-aminophenoxy)alkane, 1,3-bis(4-aminophenoxy) -2,2-dimethylpropane, 1,2-bis[2-(4-aminophenoxy)ethoxy]ethane, 9,9-bis(4-aminophenyl)fluorene, 5(6)-amino-1-(4-aminomethyl)-1,3,3-trimethylindane, 1,4-bis(4-aminophenoxy)benzene, 1,3-bis(4-aminophenoxy)benzene, 1,3-bis(3-aminophenoxy)benzene, 4,4-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, bis[4-(3-aminophenoxy)phenyl]sulfone, 2,2-bis[4-(4-aminophenoxy)phenyl]hexafluororopropane, 3,3'-dicarboxy -4,4'-diaminodiphenylmethane, 4,6-dihydroxy-1,3-phenylenediamine, 3,3'-dihydroxy-4,4'-diaminobiphenyl, 1,4-bis(4-aminophenoxy)pentane, 1,5-bis(4'-aminophenoxy)pentane, bis(γ-aminopropyl)tetramethyl disiloxane, 1,4-bis(γ-aminopropyldimethylsilyl)benzene, bis(4-aminobutyl)tetramethyl disiloxane, bis(γ-aminopropyl)tetraphenyl disiloxane, a diaminosiloxane compound represented by formula (9) and the like. They may be used alone or in combination with two or more of them.

[Formula 11]

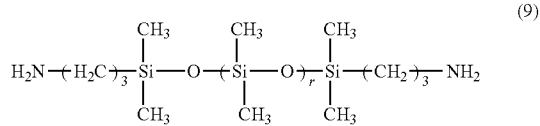

wherein r is an integer of 2 to 12.

Among them, from the viewpoint of lowering the Tg of the film obtained by heating the photosensitive layer at 200° C. or less, 1,4-diaminobenzene, 1,3-diaminobenzene, 2,4-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 3,7-diamino-dimethylbenzothiophene-5,5-dioxide, 4,4'-diaminobenzophenone, 3,3'-diaminobenzophenone, 4,4'-bis(4-aminophenyl)sulfide, 4,4'-diaminodiphenylsulfone, 4,4'-diaminobenzanilide, 1,n-bis(4-aminophenoxy)alkane, 1,3-bis(4-aminophenoxy) -2,2-dimethylpropane, 1,2-bis[2-(4-aminophenoxy)ethoxy]ethane, 9,9-bis(4-aminophenyl)fluorene, 5(6)-amino-1-(4-aminomethyl)-1,3,3-trimethylindane, 1,4-bis(4-aminophenoxy)benzene, 1,3-bis(4-aminophenoxy)benzene, 1,3-bis(3-aminophenoxy)benzene, 4,4-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, bis[4-(3-aminophenoxy)phenyl]sulfone, 4,6-dihydroxy-1,3-phenylenediamine, 3,3'-dihydroxy-4,4'-diaminobiphenyl, 1,4-bis(4-aminophenoxy)pentane, 1,5-bis(4'-aminophenoxy)pentane, bis(γ-aminopropyl)tetramethyl disiloxane, 1,4-bis(γ-aminopropyldimethylsilyl)benzene, bis(4-aminobutyl)tetramethyl disiloxane, bis(γ-aminopropyl)tetraphenyl disiloxane, a diamine represented by formula (9) are preferred. By lowering the Tg of the photosensitive layer obtained from the photosensitive resin composition of the present invention to the heating temperature during the desolvation step or less, internal stress associated with desolvation can be removed, and warping after heating can be reduced.

Similarly, by lowering the Tg of the film obtained by curing the photosensitive layer of the present invention at 200° C. or less to the above curing temperature or lower, internal stress associated with curing can be removed, and warping after heating can be reduced. For example, in the case of a photosensitive layer obtained from the photosensitive resin that employed a polyamide acid or a carboxyl group-containing polyamide acid ester in the alkali-soluble resin, the setting of Tg of a film obtained by curing the photosensitive layer at a temperature of 200° C. or less to the heating temperature during the curing step or lower can remove internal stress associated with the ring-opening reaction, and can reduce warping after heating.

When a polyamide acid and a carboxyl group-containing polyamide acid ester are synthesized, the polymer end may be sealed, as needed, with a monofunctional acid anhydride, a monofunctional carboxylic acid, or a monofunctional amine.

The degree of elongation of a film obtained by curing the photosensitive layer obtained from a photosensitive resin composition of the present invention containing a polyamide acid and a carboxyl group-containing polyamide acid ester may preferably be 5% or more, and 10% or more may be more preferred, from the viewpoint of the anti-bending property of the protective film formed on FPC.

As such a polyamide acid and a carboxyl group-containing polyamide acid ester, specifically one derived from an acid dianhydride of formula (1) in which $R_1$ is at least one selected from formula (2) or formula (3), or at least one derived from a diamine in which $R_4$ is selected from formula (4) or formula (5). Among them, it may be specifically preferred to include a combination of structures in which $R_1$ is represented by formula (2) and $R_4$ is represented by formula (4), or a combination of structures in which $R_1$ is represented by formula (2) and
$R_4$ is represented by formula (5), or a combination of structures in which $R_1$ is represented by formula (3) and
$R_4$ is represented by formula (5).

[Formula 12]

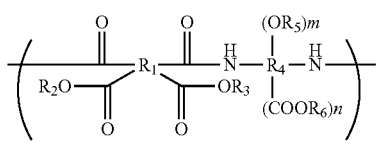

(1)

[Formula 13]

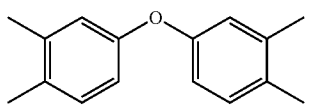

(2)

(3)

[Formula 14]

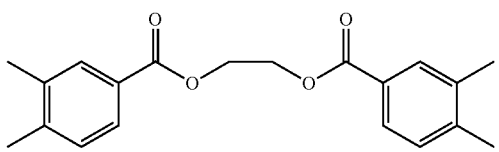

(4)

[Formula 15]

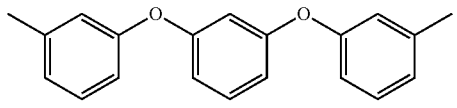

(5)

[Formula 16]

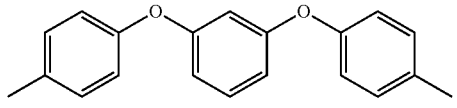

(B) A Dissolution Suppressing Agent

The photosensitive resin composition of the present invention comprises (B) a dissolution suppressing agent in order to prevent the dissolution of the alkali-soluble resin into an alkali developing solution. The dissolution suppressing agent of the present invention refers to a compound that binds via a hydrogen bond with the carboxyl group of an alkali-soluble resin having a carboxyl group. By hydrogen bonding of the carboxyl group of the alkali-soluble resin with the dissolution suppressing agent, the alkali-soluble resin is blocked and dissolution can be prevented.

As the compound having a group that forms a hydrogen bond with a carboxyl group, there can be mentioned a carboxylic acid compound, a carboxylic acid ester compound, an amide compound, a urea compound, and the like. From the viewpoint of preventing dissolution into the aqueous alkali solution and storage stability, an amide compound and a urea compound are preferred.

As an amide compound, there can be mentioned, for example, N,N-diethylacetamide, N,N-diisopropylformamide, N,N-dimethylbutylamide, N,N-dibutylacetamide, N,N-dipropylacetamide, N,N-dibutylformamide, N,N-diethylpropionamide, N,N-dimethylpropionamide, N,N'-dimethoxy-N,N'-dimethyloxamide, N-methyl-∈-caprolactam, 4-hydroxyphenyl benzamide, salicylamide, salicylanilide, acetanilide, 2'-hydroxyphenyl acetoanilide, 3'-hydroxyphenyl acetanilide, and 4'-hydroxyphenyl acetanilide.

Among them, from the viewpoint of lowering the Tg of the photosensitive layer and the film obtained by heating the above photosensitive layer at 200° C. or less, higher sensitivity of the photosensitive layer, and high film residual rate, an amide compound containing an aromatic hydroxy group may be more preferred. Specifically, 4-hydroxyphenyl benzamide, 3'-hydroxyphenyl acetanilide and 4'-hydroxyphenyl acetanilide may be mentioned. They may be used alone or in combination with two or more of them.

As a urea compound, there can be mentioned, for example, 1,3-dimethylurea, tetramethyluea, tetraethylurea, 1,3-diphenylurea, and 3-hydroxyphenylurea. Among them, from the viewpoint of higher sensitivity, higher film residual rate, and lowering the Tg of the photosensitive layer and the film obtained by heating the above photosensitive layer at 200° C. or less, a urea compound containing an aromatic hydroxy group may be more preferred. Specifically, 3-hydroxyphenylurea may be mentioned. They may be used alone or in combination with two or more of them.

When an amide compound is used, (B) the dissolution suppressing agent of the present invention may preferably be blended at 0.1 mol to 1.5 mol, and more preferably 0.15 to 1.0 mol relative to one mol of the carboxyl group of (A) the alkali-soluble resin from the viewpoint of exhibiting the effect of preventing dissolution.

When a urea compound is used, (B) the dissolution suppressing agent of the present invention may preferably be blended at 0.1 mol to 1.5 mol relative to one mol of (A) the carboxyl group of the alkali-soluble resin from the viewpoint of exhibiting the effect of preventing dissolution. From the viewpoint of exhibiting the effect of preventing dissolution and the mechanical physical properties of the polyimide obtained by curing after alkali developing, 0.15 mol to 0.5 mol may more preferably be blended.

Also, when both of an amide compound and a urea compound are used, the total amount of the amide compound and the urea compound may preferably be 0.1 mol to 1.5 mol relative to one mol of the carboxyl group of (A) the alkali-soluble resin from the viewpoint of preventing dissolution.

(C) A Photosensitizing Agent (C) The photosensitizing agent of the present invention may preferably be a compound that generates an acid by an active ray irradiation. Among them a quinone diazide compound is preferred. For example, those described in U.S. Pat. Nos. 2,797,213 and 3,669,658 may be used. Among them, an ester compound of a phenol compound and 1,2-naphthoquinone-2-diazide-4-sulfonic acid or 1,2-naphthoquinone-2-diazide-5-sulfonic acid may be preferred. They may be used alone or in combination with two or more of them.

The amount blended of (C) the photosensitizing agent of the present invention may preferably be 5-30 parts by weight relative to 100 parts by weight of (A) the alkali-soluble resin, and more preferably 10-20 parts by weight. The amount blended of the photosensitizing agent may preferably be 5 parts by weight or more from the viewpoint of sensitivity, and 30 parts by weight or less from the viewpoint of light absorption.

(D) An Organic Solvent

From the viewpoint of solubility into the alkali developing solution, (D) the organic solvent of the present invention may preferably be an ester compound such as γ-butyrolactone and ethyl lactate, and ether such as tetrahydrofuran. These organic solvents may be used alone or in combination with two or more of them. The organic solvent of the present invention may preferably be 120-900 parts by weight relative to 100 parts by weight of the alkali-soluble resin.

When, as the organic solvent, N,N-dimethylformamide, N,N-dimethylacetamide, N,N-dimethylpropionamide, N-methyl-2-pyrrolidone, N-acetyl-2-pyrrolidone, dimethylimidazolidinone or dimethylsulfonide is used, the dissolution rate of the alkali-soluble resin into the developing solution becomes enhanced, thereby reducing the film residual rate.

The organic solvent of the present invention may be blended, as needed, with a solvent of which boiling point is lower than that of γ-butyrolactone. By blending a low-boiling solvent, foaming during drying can be prevented.

As a low-boiling solvent, there can be mentioned a ketone such as acetone, methyl ethyl ketone, and methyl isobutyl ketone; an alcohol such as ethylalcohol, isopropyl alcohol, n-butanol, ethyleneglycol, diethyleneglycol, triethyleneglycol, propyleneglycol, and hexyleneglycol; an ether such as 1,4-dioxane, trioxane, diethylacetal, 1,2-dioxorane, diethyleneglycol dimethylether, tetrahydrofuran, and anisole; an ester such as ethyl acetate, methyl benzoate, ethylene glycol monomethylether acetate, ethylene glycol monoethylether acetate, ethylene glycol monopropylether acetate, ethylene glycol diacetate, propylene glycol monomethylether acetate, propylene glycol monoethylether acetate, propyleneglycol monopropylether acetate, propylene glycol monobutyoether acetate, propylene glycol diacetate, diethylene glycol monomethylether acetate, diethylene glycol monoethylether acetate, and diethylene glycol diacetate; and a hydrocarbon such as n-heptane, n-octane, cyclohexane, benzene, toluene, xylene, ethylbenzene, and diethylbenzene.

(E) A Crosslinking Agent

The photosensitive resin composition of the present invention may be blended, as needed, with (E) a crosslinking agent. This makes it possible to increase the molecular weight of the alkali-soluble resin during curing. As the crosslinking agent, a tetracarboxylic acid compound represented by formula (6) or a tetracarboxylic acid ester compound, and a polyamide acid compound represented by formula (7) or a carboxyl group-containing polyamide acid ester compound may be preferred.

[Formula 17]

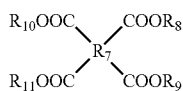

(6)

wherein $R_7$ is a tetra-valent organic group, and $R_8$ to $R_{11}$ are each hydrogen or an organic group having 1-20 carbons, and may be the same or different.

[Formula 18]

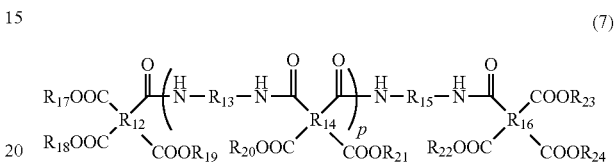

(7)

wherein $R_{12}$, $R_{14}$, and $R_{16}$ are each a tetra-valent organic group, and may be the same or different; $R_{13}$ and $R_{15}$ are a divalent to tetra-valent organic group, and may be the same or different; $R_{17}$ to $R_{24}$ are each hydrogen or an organic group having 1-20 carbons, and may be the same or different; p is an integer of 0 to 100.

From the viewpoint of exhibiting the crosslinking effect, the amount blended of (E) the crosslinking agent of the present invention may preferably be 0.1 mol to 1.5 mol relative to the moles of the residual amino groups of the polyamide acid or a carboxyl group-containing polyamide acid ester, and more preferably 0.5 mol to 1.1 mol.

The amount of the residual amino groups can be calculated by reacting phthalic anhydride to a polyamide acid or a carboxyl group-containing polyamide acid ester. A specific method is described below.

An acetonitrile solution of phthalic anhydride is prepared. The concentrations prepared are 3 to 4 levels in the range of $1 \times 10^{-6}$-$1 \times 10^{-3}$ (g/ml)

The area of each concentration is determined by high performance liquid chromatography (HPLC).

From the concentration and area of phthalic anhydride, a calibration curve is created.

A γ-butyrolactone solution (21 wt %) of polyamide acid or a carboxyl group-containing polyamide acid ester is prepared.

To the above solution, phthalic anhydride (0.01 mol) is blended, and stirred overnight at room temperature.

The solution after stirring is diluted 50-fold with acetonitrile to prepare a sample solution.

The above sample solution is loaded to HPLC, and from the amount of phthalic anhydride consumed, the amount of residual amino groups is calculated.

(Calculation Method)

The amount (X) of the residual amino groups is calculated from the following equation (1).

$$X = 0.01 - \{(S \times C)/[A(P) \times D \times 100]\}$$ Equation (1)

As used herein, S is the slope of the calibration curve, A(P) is the area of the sample solution, D is the dilution factor (wt %), and C is the solid fraction (wt %) of a polyamide acid or a carboxyl group-containing polyamide acid ester.

(F) A Thermal Base-Generating Agent

The photosensitive resin composition of the present invention may comprise, as needed, (F) a thermal base-generating agent. The thermal base-generating agent is a compound that generates a base by heating. For example, a base such as an amine may be protected with a dicarbonate compound that forms a salt structure with a sulfonic acid, or protected with an acid chloride. Thereby, the basicity will not be exhibited, will be stable at room temperature, and deprotected by heating to become a thermal base-generating agent that generates a base.

When a polyamide acid or a carboxyl group-containing polyamide acid ester is used as the alkali-soluble resin, the temperature of heated imidation after development can be made relatively low by blending the above thermal base-generating agent.

As the thermal base-generating agent, there can be specifically mentioned U-CAT (registered trademark) SA810, U-CAT SA831, U-CAT SA841, U-CAT SA851 (these are trade names, manufactured by Sun-Apro Co., Ltd.), N-(isopropoxycarbonyl)-2,6-dimethylpiperidine, N-(tert-butoxycarbonyl)-2,6-dimethylpiperidine, N-(benzyloxycarbonyl)-2,6-dimethylpiperidine, and the like.

From the viewpoint of storage stability of the photosensitive resin composition, stability by desolvation, alkali-solubility and ion migration, N-(isopropoxycarbonyl)-2,6-dimethylpiperidine, N-(tert-butoxycarbonyl)-2,6-dimethylpiperidine, and N-(benzyloxycarbonyl)-2,6-dimethylpiperidine are preferred. Said compounds may be synthesized by a known method as described in, for example, Chemistry Letters, Vol. 34, No. 10 (2005).

From the viewpoint of imidation promotion and developing property, the amount blended of (F) the thermal base-generating agent may preferably be 1-30 parts by weight, preferably 10-20 parts by weight, relative to 100 parts by weight of the alkali-soluble resin.

(A Photosensitive Film, a Resin Pattern)

Next, a method of forming a resin pattern using the photosensitive resin composition of the present invention will be explained. In accordance with the present invention, by conducting at least 1-5 steps described below, the resin pattern can be obtained.

1. A Step of Applying A Photosensitive Resin Composition on the Substrate

A substrate includes, but not limited to, a silicon wafer, ceramics, gallium arsenide, a glass epoxy resin, a copper foil and the like. As an application method, there can be used a known method such as a roll coating method, a doctor knife method, a comma coating method, a spray coating method, a screen printing method, a spin coating method, and bar coating method. Also, though the coated film thickness may vary with the application method, the solid concentration of the composition, viscosity etc., it is generally applied to a film thickness after drying of 0.1-150 µm.

2. A Step of Desolvating the Photosensitive Resin Composition Applied on the Substrate to Form a Photosensitive Layer For desolvation, an oven, a hot plate, an infrared ray etc. may be used. From the viewpoint of thermal stability of the photosensitive resin composition, it may preferably be carried out at 50° C. to 120° C. for one minute to several hours.

3. A Step of Irradiating an Active Ray on the Desired Portion of the Photosensitive Layer An active ray includes an X ray, an electron beam, an ultraviolet ray, a visible light etc. As the light source, there can be used a low-pressure mercury lamp, high-pressure mercury lamp, an ultra high-pressure mercury lamp, a halogen lamp and the like. In accordance with the present invention, the i line (365 nm), h line (405 nm), and g line (436 nm) of a mercury lamp may preferably used. The method of irradiating an active ray may be any of contact exposure and projection exposure. Considering the sufficient absorption of the active ray by the photosensitizing agent and the time of irradiating the active ray, the exposure amount of the active ray may preferably be 100 mJ/cm$^2$-3000 mJ/cm$^2$, more preferably 500 mJ/cm$^2$-2000 mJ/cm$^2$, and more preferably 500 mJ/cm$^2$-1500 mJ/cm$^2$.

4. A Developing Step of Dissolving the Active Ray-irradiated Portion with an Aqueous Alkali Solution The developing solution may be any aqueous alkali solution and is not specifically limited. It may preferably be an aqueous sodium hydroxide solution, an aqueous potassium hydroxide solution, an aqueous sodium carbonate solution, and an aqueous potassium carbonate solution.

To these aqueous alkali solutions, a polar solvent such as N-methyl-2-pyrrolidone, N,N-dimethylformamide, N,N-dimethylacetamide, dimethyl sulfoxide, γ-butyrolactone, dimethylacrylamide; an alcohol such as methanol, ethanol, and isopropanol; an ester such as ethyl lactate and propylene glycol monomethylether acetate; a ketone such as cyclopentanone, cyclohexanone, isobutyl ketone, and methyl isobutyl ketone, alone or in combination of several of them, may be added.

The developing solution is rinse-treated using a rinse agent. As the rinse agent, there can be mentioned water, water to which an alcohol such as ethanol and isopropyl alcohol, an ester such as ethyl lactate, propylene glycolmonomethylether acetate have been added. Development and rinse can be carried out by a soaking method, a spray method, a paddle method etc. For example, a 1 wt % aqueous sodium carbonate solution may be used as the developing solution, and after warming the liquid temperature to 40° C., development and rise can be carried out by the soaking method or the spray method.

5. A Curing Step to Obtain a Resin Pattern by Heating the Remaining Portion after Development After development, by applying a temperature of 100° C. to 200° C., a heat resistance property may be imparted to the resin pattern. The heating treatment may be carried out for 5 minutes to 5 hours while increasing the temperature stepwise, or continuously increasing in a selected temperature range. By way of example, there is a method of heat treatment for 60 minutes at 120° C. for 30 minutes at 150° C., and 60 minutes at 200° C.

Processed goods thus obtained are semiconductor devices, liquid crystal displays, multilayered printed wiring boards and the like.

It is also possible to use the photosensitive resin composition of the present invention as the photosensitive film. The photosensitive film as used herein is a film made of a flexible carrier film of polyester etc. and a photosensitive layer obtained by the application of a photosensitive resin composition and desolvation.

It is also possible to provide a cover film on the above photosensitive film and to use as a laminated film.

When the photosensitive resin composition of the present invention is made a photosensitive film, at least the following steps of 1 and 2 may be used for the manufacture.

1. A Step of Applying the Photosensitive Resin Composition on a Carrier Film

The photosensitive resin composition of the present invention is applied on a carrier film. As the carrier film, a low-density polyethylene, high-density polyethylene, polypropylene, polyester, polycarbonate, polyacrylate, ethylene/cyclodecene copolymer (Mitsui Chemicals, Inc., trade name: APEL) etc. may be used. The thickness of the carrier film may usually be 15-100 μm, preferably be 15-75 μm, considering applicability, attachability, rolling properties, tenacity, cost etc.

The application of the photosensitive resin composition may be carried out using a reverse roll coater, a gravure roll coater, a comma coater, a curtain coater, etc. on the above carrier film in a known method.

2. A Step of Forming a Photosensitive Film by the Desolvation of the Photosensitive Resin Composition The desolvation of the applied film obtained in the process of 1 may be carried out by a drier using a hot-air, a far-infrared radiation and a near-infrared radiation at a temperature of 50-120° C. The film thickness of the photosensitive layer obtained by desolvation may preferably be 5-100 μm, more preferably 5-50 μm. From the viewpoint of reliable insulation, the film thickness may preferably be 5 μm or more, and from the viewpoint of obtaining a favorable line image, it may preferably be 100 μm or less.

The photosensitive resin composition of the present invention can be used as a coverlay. The coverlay refers to a protective film that protects a wiring formed on a silicon wafer, a copper clad laminate, FPC etc.

From the photosensitive resin composition of the present invention, a photosensitive film can be produced, which, when a coverlay is to be formed on FPC, can be used in the following steps.

1. A Step of Forming a Photosensitive Layer by Laminating a Photosensitive Film Made of the Photosensitive Resin Composition of the Present Invention on a Circuit-formed Surface Such as FPC By superposing the above photosensitive film on a circuit-formed surface such as FPC, and laminating under heating at 40-150° C., preferably 40-120° C., more preferably 60-110° C. at a pressure of 0.2-4 MPa in a known method such as plane lamination, roll lamination, and vacuum press, a photosensitive layer can be laminated. By setting the lamination-possible temperature at 40° C. or more, tacking at the time of position alignment before laminating will not take time, and by setting at 150° C. or less, imidation will not excessively proceed giving allowance of time, and thus the margin of step can become wider. The lamination-possible temperature as used herein means a temperature that permits sufficient embedding into the pattern without the problem of residual air bubbles and permits the control of the photosensitive layer to a viscosity under which the resin does not flow out of the pattern. Also by setting the Tg of the photosensitive layer lower than the lamination temperature, laminating of the photosensitive film can be favorably carried out. After laminating the photosensitive layer, the carrier film may or may not be peeled off. When the carrier film is not peeled off at this time, it will be peeled off after the exposure step.

2. A Step of Irradiating an Active Ray on the Photosensitive Layer Obtained in the Above Step The photosensitive layer is exposed to light through a photomask on which an arbitrary pattern has been drawn in order to form micropores and extra fine lines. The amount exposed may vary with the composition of the photosensitive resin composition, and is usually 100-3,000 mJ/cm². As the active ray used at this time, a low-pressure mercury lamp, high-pressure mercury lamp, an ultra high-pressure mercury lamp, a halogen lamp and the like may be used. In accordance with the present invention, the i line (365 nm), h line (405 nm), and g line (436 nm) of a mercury lamp may preferably used. The method of irradiating an active ray may be any of contact exposure and projection exposure.

3. A Step of Developing and Rinsing the Active Ray-irradiated Portion

After exposure, developing may be carried out using a developing solution by known method such as a soaking method and a spray method. As the developing solution, an aqueous sodium hydroxide solution, an aqueous potassium hydroxide solution, an aqueous sodium carbonate solution, and an aqueous potassium carbonate solution etc. may be used. After development, rinsing may be carried out using a rinse solution. As the rinse solution, water or an organic solvent-added water may be used.

4. Formation of the Resin Pattern by Heating

By heating the pattern obtained by developing, a resin pattern can be formed. Heating may be carried out at a temperature of 100° C. to 200° C. for 5 minutes to 5 hours, either continuously or sequentially. And the processed product can be obtained.

As the processed product thus obtained, FPC, multilayered printed wiring board etc. may be mentioned.

EXAMPLES

The present invention will now be specifically explained with reference to Examples, but it should be noted that the present invention is not limited to them in any way.
(Synthesis of an Alkali-Soluble Resin and the Measurement of the Alkali Dissolution Rate)
1. A Study on Dissolution Characteristic of the Alkali-soluble Resin The dissolution characteristic of the alkali-soluble resin was evaluated in the following procedure.
1-1. Coating A coating stand (manufactured by MATSUKI KAGAKU) on which vacuum adsorption and heating may be carried out was heated at 60° C. On the coating stand, an electrolytic copper foil sheet (F3-ws, manufactured by FURUKAWA CIRCUIT FOIL) was placed with the gloss surface facing upward, and was vacuum-adsorbed so as to be stuck on the electrolytic copper foil sheet. On this electrolytic copper foil sheet, using an applicator (manufactured by MATSUKI KAGAKU), an alkali-soluble resin was applied to a film thickness of 30 μm.
1-2. Desolvation After desolvation under the condition of 60° C. for 30 minutes on the above coating stand, desolvation was carried out under the condition of 95° C. for 20 minutes using a drier (SPH-201, manufactured by ESPEC CORP.)
1-3. An Alkali Dissolution Test The film obtained in 1-2 was soaked in a 1 wt % aqueous sodium carbonate solution that had been warmed to 40° C., and shaken for 10 seconds at a ratio of once every 30 seconds. The time required to complete dissolution and the dissolution rate of the alkali-soluble resin in the aqueous sodium carbonate solution were calculated from the following equation (2):

Alkali dissolution rate of the alkali-soluble resin=[film thickness (μm) before dissolution]/[dissolution time (sec)]    ...(Equation 2)

(1) A Polyamide Acid (i) with γ-Butyrolactone (Organic Solvent) as the Solvent

To a three-necked separable flask, 20 g of 4,4-diaminodiphenyl ether and $1.9 \times 10^2$ g of γ-butyrolactone were placed and stirred to be a homogeneous solution. Then, 0.189 g of phthalic anhydride was added thereto, and stirred to be a homogeneous solution while cooling on the ice. Then, 30 g of 4,4'-oxydiphthalic acid dianhydride was added and stirred for one hour while cooling on the ice and then for six hours at room temperature to obtain a polyamide acid (i). After the polyamide acid was pressure-filtered with a 5 µm filter, the reduced viscosity (the polyamide acid: 20 mg/NMP: 50 ml, 30° C.) was measured and found to be 0.49. Also, in the above procedure, an alkali dissolution test was carried out. The results are shown in Table 1.

(2) A Polyamide Acid (ii) with N,N-Dimethylacetamide (Organic Solvent) as the Solvent To a three-necked separable flask, 20 g of 4,4-diaminodiphenyl ether and $1.9 \times 10^2$ g of N,N-dimethylacetamide were placed and stirred to be a homogeneous solution. Then, 0.189 g of phthalic anhydride was added thereto, and stirred to be a homogeneous solution while cooling on the ice. Then, 30 g 4,4'-oxydiphthalic acid dianhydride was added and stirred for one hour while cooling on the ice and then for six hours at room temperature to obtain a polyamide acid (ii). After the polyamide acid was pressure-filtered with a 5 µm filter, the reduced viscosity (the polyamide acid: 20 mg/NMP: 50 ml, 30° C.) was measured and found to be 0.52. Also, in the above procedure, an alkali dissolution test was carried out. The results are shown in Table 1.

(3) A Polyamide Acid (iii) with γ-Butyrolactone (Organic Solvent) as the Solvent To a three-necked separable flask, 20 g of 1,3-bis(3-aminophenoxy)benzene and 220 g of γ-butyrolactone were placed and stirred to be a homogeneous solution. Then, 21 g 4,4'-oxydiphthalic acid dianhydride was added and stirred for one hour while cooling on the ice and then for 24 hours at room temperature to obtain a polyamide acid (iii). After the polyamide acid was pressure-filtered with a 5 µm filter, the reduced viscosity (the polyamide acid: 20 mg/NMP: 50 ml, 30° C.) was measured and found to be 0.92. Also, in the above procedure, an alkali dissolution test was carried out. The results are shown in Table 1.

(4) A Polyamide Acid (iv) with γ-Butyrolactone (Organic Solvent) as the Solvent

To a three-necked separable flask, 20 g of 1,3-bis(4-aminophenoxy)benzene and 220 g of γ-butyrolactone were placed and stirred to be a homogeneous solution. Then, 21 g 4,4'-oxydiphthalic acid dianhydride was added and stirred for one hour while cooling on the ice and then for 24 hours at room temperature to obtain a polyamide acid (iv). After the polyamide acid was pressure-filtered with a 5 µm filter, the reduced viscosity (the polyamide acid: 20 mg/NMP: 50 ml, 30° C.) was measured and found to be 0.92. Also, in the above procedure, an alkali dissolution test was carried out. The results are shown in Table 1.

(5) A Polyamide Acid (v) with γ-Butyrolactone (Organic Solvent) as the Solvent

To a three-necked separable flask, 20 g of 1,3-bis(3-aminophenoxy)benzene and 220 g of γ-butyrolactone were placed and stirred to be a homogeneous solution. Then, 28 g ethylene glycol-bis-anhydrous trimellitic acid ester was added and stirred for one hour while cooling on the ice and then for 24 hours at room temperature to obtain a polyamide acid (v). After the polyamide acid was pressure-filtered with a 5 µm filter, the reduced viscosity (the polyamide acid: 20 mg/NMP: 50 ml, 30° C.) was measured and found to be 0.86. Also, in the above procedure, an alkali dissolution test was carried out. The results are shown in Table 1.

(6) A Polyamide Acid (vi) with γ-Butyrolactone (Organic Solvent) as the Solvent

To a three-necked separable flask, 20 g of 1,3-bis(4-aminophenoxy)benzene and 220 g of γ-butyrolactone were placed and stirred to be a homogeneous solution. Then, 28 g ethylene glycol-bis-anhydrous trimellitic acid ester was added and stirred for one hour while cooling on the ice and then for 24 hours at room temperature to obtain a polyamide acid (vi). After the polyamide acid was pressure-filtered with a 5 µm filter, the reduced viscosity (the polyamide acid: 20 mg/NMP: 50 ml, 30° C.) was measured and found to be 0.94. Also, in the above procedure, an alkali dissolution test was carried out. The results are shown in Table 1.

(7) A Polyamide Acid (vii) with γ-Butyrolactone (Organic Solvent) as the Solvent To a three-necked separable flask, 11.46 g of 1,4-bis(4-aminophenoxy)pentane and 105 g of γ-butyrolactone were placed and stirred to be a homogeneous solution. Then, 16.41 g ethylene glycol-bis-anhydrous trimellitic acid ester was added and stirred for one hour while cooling on the ice and then for 24 hours at room temperature to obtain a polyamide acid (vii). After the polyamide acid was pressure-filtered with a 5 µm filter, the reduced viscosity (the polyamide acid: 20 mg/NMP: 50 ml, 30° C.) was measured and found to be 1.06. Also, in the above procedure, an alkali dissolution test was carried out. The results are shown in Table 1.

(8) A Polyamide Acid (viii) with γ-Butyrolactone (Organic Solvent) as the Solvent To a three-necked separable flask, 20 g of 1,3-bis(3-aminophenoxy)benzene and 220 g of γ-butyrolactone were placed and stirred to be a homogeneous solution. Then, 31 g 1,3-dihydro-1,3-dioxo-5-isobenzenefurane carboxylic acid-1,4-phenylene ester was added and stirred for one hour while cooling on the ice and then for 24 hours at room temperature to obtain a polyamide acid (viii). After the polyamide acid was pressure-filtered with a 5 µm filter, the reduced viscosity (the polyamide acid: 20 mg/NMP: 50 ml, 30° C.) was measured and found to be 0.94. Also, in the above procedure, an alkali dissolution test was carried out. The results are shown in Table 1.

(9) A Polyamide Acid (ix) with γ-Butyrolactone (Organic Solvent) as the Solvent

To a three-necked separable flask, 20 g of 1,3-bis(3-aminophenoxy)benzene and 220 g of γ-butyrolactone were placed and stirred to be a homogeneous solution. Then, 20 g of 4,4'-oxydiphthalic acid dianhydride was added and stirred for one hour while cooling on the ice and then for 24 hours at room temperature to obtain a polyamide acid (ix). After the polyamide acid was pressure-filtered with a 5 µm filter, the reduced viscosity (the polyamide acid: 20 mg/NMP: 50 ml, 30° C.) was measured and found to be 0.6. Also, in the above procedure, an alkali dissolution test was carried out. The results are shown in Table 1.

(10) A Polybenzoxazol Precursor Resin (x) with γ-Butyrolactone (Organic Solvent) as the Solvent In a 1 L separable flask, 72.4 g of 4,4'-diphenylether dicarboxylic acid and 3.7 g of N,N-dimethylaminopyridine were added to 600 g of DMAc, to which solution 75.0 g of thionyl chloride was added dropwise, and stirred for one hour. This solution was added at 0° C. to 109.9 g of 2,2-bis(3-amino-4-hydroxyphenyl)hexafluoropropane dissolved to 300 g of DMAc in a 1 L separable flask, and stirred for six hours at room temperature. After this was diluted in DMAc (1000 g), it was added dropwise to water while stirring, and the polymer deposited was filtered and dried under vacuum to obtain a polybenzoxazole precursor. 10 g of this polymer was added to 4.6 g of γ-butyrolactone and stirred to homogeneity using a mix rotor to obtain a polybenzoxazol precursor resin (x) with γ-butyrolactone (organic solvent) as the solvent. After stirring, it was pressure-filtered with a 5 µm filter, the reduced viscosity (the polyamide acid: 20 mg/NMP: 50 ml, 30° C.) was measured and found to be 0.45. Also, in the above procedure, an alkali dissolution test was carried out. The results are shown in Table 1.

TABLE 1

| Alkali-soluble resin | Dissolution rate (μm/sec) |
|---|---|
| (i) | 0.10 |
| (ii) | 0.15 |
| (iii) | 0.16 |
| (iv) | 0.07 |
| (v) | 0.13 |
| (vi) | 0.08 |
| (vii) | 0.04 |
| (viii) | 0.08 |
| (ix) | 0.16 |
| (x) | 0.001 |

(Preparation of a Photosensitive Film and the Alkali Dissolution Test)

2. The Alkali Dissolution Test of the Photosensitive Layer (Film Residual Rate)

The preparation of a photosensitive layer and the measurement of the film residual rate were carried out in the following procedure.

2-1. Treatment of the Substrate

The surface of a copper-laminated glass epoxy substrate (thickness: 0.4 mm, manufactured by Matsushita Electric Works Ltd.) was scrub-polished (abrasive, SAKURUNDUM RF220, Nihon Kensaku Toryu K.K.) by Jet Scribe In (manufactured by ISHII HYOKI SHA).

2-2. Coating

To the substrate obtained in 2-1, the photosensitive polyamide acid composition was coated to a film thickness after desolvation of 30 μm using a height-adjusted YBA type baker applicator (manufactured by YOSHIMITSU SEIKI).

2-3. Desolvation

After coating, a sample was placed on a hot plate (Shamal hot plate HHP-412, manufactured by AS ONE Corp.), and desolvated under the condition of 60° C. for 30 minutes and 95° C. for 20 minutes.

2-4. UV Irradiation

After desolvation, using a mask aligner (MA-10, manufactured by MIKASA) equipped with a pattern mask (manufactured by TOKYO PROCESS SERVICE) having round core patterns with a diameter of 10 μm-500 μm, a UV ray was irradiated under the condition of exposure amount of 1000 mJ/cm$^2$ (UV350 nm-corrected).

2-5. Development

The substrate obtained in 2-4 was soaked in 1 wt % aqueous sodium carbonate solution for development. Development was carried out at a liquid temperature of 40° C.

2-6. Measurement of Film Residual Thickness

Using the Stylus Profiler (DEKTAK, ULVAC, Inc.), the film thickness after desolvation (before development) and the film thickness of the nonirradiated portion after development were measured. The film thickness after development is divided by the film thickness before development and then multiplied by 100 to obtain the film residual rate.

Working Example 1

10 g of a polyamide acid (i) with γ-butyrolactone (organic solvent) as the solvent, 0.86 g of 4'-hydroxyphenyl acetoanilide (0.7 equivalent relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 1. Using the polyamide acid composition 1 obtained, an alkali dissolution test was carried out in the above methods 2-1 to 2-6, and the results shown in Table 2 were obtained.

[Formula 19]

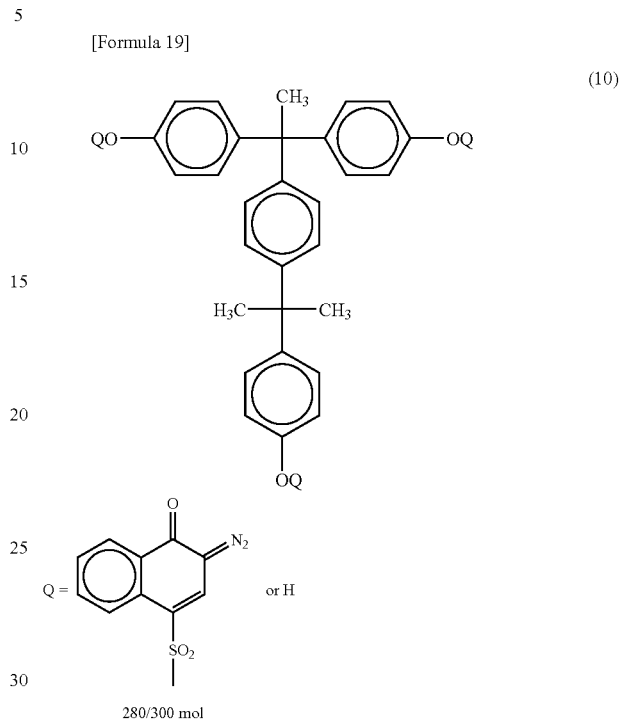

(10)

in Formula (10), the introduction rate of Q is $^{280}/_{300}$ mol.

Working Example 2

10 g of a polyamide acid (i) with γ-butyrolactone (organic solvent) as the solvent, 0.78 g of 4-hydroxyphenyl benzamide (0.7 equivalent relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 2. Using the polyamide acid composition 2 obtained, an alkali dissolution test was carried out in the above methods 2-1 to 2-6, and the results shown in Table 2 were obtained.

Working Example 3

10 g of a polyamide acid (i) with γ-butyrolactone (organic solvent) as the solvent, 0.63 g of 3-hydroxyphenyl urea (0.5 equivalent relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 3. Using the polyamide acid composition 3 obtained, an alkali dissolution test was carried out in the above methods 2-1 to 2-6, and the results shown in Table 2 were obtained.

Comparative Example 1

10 g of a polyamide acid (i) with γ-butyrolactone (organic solvent) as the solvent and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 4. Using the polyamide acid composition 4 obtained, an alkali dissolution test was carried out in the above methods 2-1 to 2-6, and the results shown in Table 2 were obtained.

Comparative Example 2

10 g of a polyamide acid (ii) with N,N-dimethylacetamide (organic solvent) as the solvent and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 5. Using the polyamide acid composition 5 obtained, an alkali dissolution test was carried out in the above methods 2-1 to 2-6, and the results shown in Table 2 were obtained.

Comparative Example 3

10 g of a polyamide acid (i) with γ-butyrolactone (organic solvent) as the solvent, 1.0 g of N,N-dimethylacetamide (equivalent relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 6. Using the polyamide acid composition 6 obtained, an alkali dissolution test was carried out in the above methods 2-1 to 2-6, and the results shown in Table 2 were obtained.

Comparative Example 4

10 g of a polyamide acid (i) with γ-butyrolactone (organic solvent) as the solvent, 2.48 g of 4'-hydroxyphenyl acetoanilide (2 equivalents relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 7. Using the polyamide acid composition 7 obtained, an alkali dissolution test was carried out in the above methods 2-1 to 2-6, and the results shown in Table 2 were obtained.

TABLE 2

| | The exposure amount (mJ/cm$^2$) | Film residual rate (%) |
|---|---|---|
| Working Example 1 | 1000 | 91 |
| Working Example 2 | 1000 | 90 |
| Working Example 3 | 1000 | 93 |
| Comparative Example 1 | 1000 | The exposed portion was not dissolved |
| Comparative Example 2 | 1000 | 75 |
| Comparative Example 3 | 1000 | The exposed portion was not dissolved |
| Comparative Example 4 | 1000 | 80 |

(Preparation of a Photosensitive Film, an Alkali Dissolution Test, Evaluation of Physical Properties)
3. Evaluation of Physical Properties
3-1. Measurement of Tg
3-1-1. Tg Measurement after Desolvation (Tg-1)

For a film prepared under the following condition using a photosensitive resin composition, Tg was measured using a heat, stress and distortion-measuring instrument (TMA/SS6100, manufactured by SEIKO INSTRUMENTS NANOTECHNOLOGY) in a nitrogen atmosphere (flow rate 250 cc/min) at a temperature range of 30° C. to 200° C.

Coating: A coating stand (manufactured by MATSUKI KAGAKU) on which vacuum adsorption and heating may be carried out was heated at 60° C. On the coating stand, a polyester film (R-310-25, manufactured by MITSUBISHI POLYESTER) was placed, and was vacuum-adsorbed so as to be stuck on the above polyester film. On this polyester film, using an applicator (manufactured by MATSUKI KAGAKU), a photosensitive resin composition was applied to a film thickness of 30 μm after desolvation.

Desolvation:
After desolvation under the condition of 60° C. for 30 minutes on the above coating stand, desolvation was carried out under the condition of 95° C. for 20 minutes using a drier (SPH-201, manufactured by ESPEC CORP.)
3-1-2. Tg Measurement after Heating to 200° C. (Tg-2)

The photosensitive resin composition was subjected to coating, desolvation, bake, and copper etching under the following condition to prepare a film. For the film prepared, Tg was measured using a heat, stress and distortion-measuring instrument (TMA/SS6100, manufactured by SEIKO INSTRUMENTS NANOTECHNOLOGY) in a nitrogen atmosphere (flow rate 250 cc/min) at a measurement range of 30° C. to 300° C.

Coating: A coating stand (manufactured by MATSUKI KAGAKU) on which vacuum adsorption and heating may be carried out was heated at 60° C. On the coating stand, an electrolytic copper foil sheet (F3-ws, manufactured by FURUKAWA CIRCUIT FOIL) was placed with the gloss surface facing upward, and was vacuum-adsorbed so as to be stuck on the electrolytic copper foil sheet. On this electrolytic copper foil sheet, using an applicator (manufactured by MATSUKI KAGAKU), a photosensitive resin composition was applied to a film thickness of 30 μm.

Desolvation: After desolvation under the condition of 60° C. for 30 minutes on the above coating stand, desolvation was carried out under the condition of 95° C. for 20 minutes using a drier (SPH-201, manufactured by ESPEC CORP.).

Bake: Using a drier (SPH-201, manufactured by ESPEC CORP.), drying was carried out at a temperature increase rate of 5° C./min in an air atmosphere under the condition shown in Table 3.

TABLE 3

| Temperature (° C.) | Retention time (min) |
|---|---|
| 95 | 10 |
| 120 | 60 |
| 150 | 30 |
| 200 | 60 |

Etching: Etching was carried out using an aqueous ferric chloride solution (40 Baume, manufactured by TSURUMI SODA).

Drying: After etching, it was allowed to stand overnight at a temperature of 23° C. and a humidity of 50%.
3-2. Observation of Warping For the photosensitive resin composition, the presence or absence of warping was observed by placing the sheet prepared in 3-1-1 on a desk. The sheet for which warping was observed was denoted as x, and the sheet for which no warping was observed was denoted as ○.

3-3. Laminate
3-3-1. Preparation of a photosensitive film
Using a photosensitive resin composition, a photosensitive film was prepared under the condition of 3-1-1.
3-3-2. Substrate Preparation
A copper-laminated glass epoxy substrate (ELC-4762-A, manufactured by SUMITOMO BAKELITE CO., LTD.) was previously heated to 60° C. by a drier.
3-3-3. Laminating Procedure
Using a hot mill laminator (AL-700, manufactured by Asahi Kasei Corporation), the photosensitive film prepared in 3-3-1 was laminated on the glass epoxy substrate prepared in 3-3-2 under the condition shown in Table 4. When laminating was possible, it was denoted as x, and when impossible, it was denoted as 0. When it could not be laminated under the above condition, temperature was increased stepwise until laminating become possible.

TABLE 4

| Temperature | 100° C. |
|---|---|
| Pressure | 0.35 MPa |
| Feed speed | 0.5 m/min |

* means that laminating at 100° C. was x, and thus it was carried out at a higher temperature.

3-4. The Alkali Dissolution Test of the Photosensitive Resin Composition
3-4-1. UV Irradiation
The substrate prepared in the procedures of 3-3-1 to 3-3-3 was cut into a size of 5 cm long and 1.5 cm wide, and the half of the substrate was covered with a aluminum foil, to which UV ray was irradiated using a mask aligner (MA-10, manufactured by MIKASA) not equipped with a pattern mask, under the condition of exposure amount of 1000 mJ/cm$^2$ (UV350-corrected).
3-4-2. The Alkali Dissolution Test of the Photosensitive Layer
The substrate prepared in 3-4-1 was soaked in a 1 wt % aqueous sodium carbonate solution that had been warmed to 40° C., and shaken for 10 seconds at a ratio of once every 30 seconds. The time required to complete dissolution was set as the dissolution time, and the dissolution rate of the photosensitive layer was calculated from the following equation (3):

Alkali dissolution rate of the photosensitive layer= [film thickness (μm) before dissolution]/[dissolution time (sec)]      (Equation 3)

3-5. Measurement of Film Residual Thickness
Using the Stylus Profiler (DEKTAK, ULVAC, Inc.), the film thickness after desolvation (before development) and the film thickness of the nonirradiated portion after development were measured. The film thickness after development was divided by the film thickness before development and then multiplied by 100 to obtain the film residual rate.

Working Example 4

10 g of a polyamide acid (iii) with γ-butyrolactone (organic solvent) as the solvent, 0.26 g of 3'-hydroxyphenyl acetoanilide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 8. Using the polyamide acid composition 8 obtained, performance evaluation was carried out in the above methods 3-1 to 3-5, and the results shown in Table 5 were obtained.

[Formula 20]

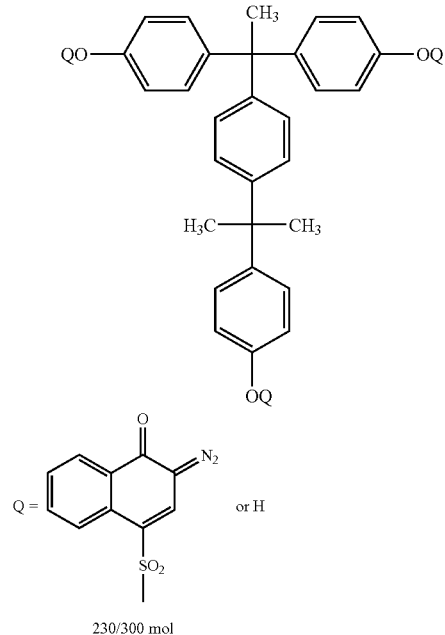

(11)

230/300 mol in Formula (11), the introduction rate of Q is $^{230}/_{300}$ mol.

Working Example 5

10 g of a polyamide acid (iii) with γ-butyrolactone (organic solvent) as the solvent, 0.26 g of 4'-hydroxyphenyl acetoanilide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 9. Using the polyamide acid composition 9 obtained, performance evaluation was carried out in the above methods 3-1 to 3-5, and the results shown in Table 5 were obtained.

Working Example 6

10 g of a polyamide acid (iii) with γ-butyrolactone (organic solvent) as the solvent, 0.23 g of 4-hydroxyphenyl benzamide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 10. Using the polyamide acid composition 10 obtained, performance evaluation was carried out in the above methods 3-1 to 3-5, and the results shown in Table 5 were obtained.

Working Example 7

10 g of a polyamide acid (iii) with γ-butyrolactone (organic solvent) as the solvent, 0.26 g of 3-hydroxyphenyl urea (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 11. Using the polyamide acid composition 11 obtained, performance evaluation was carried out in the above methods 3-1 to 3-5, and the results shown in Table 5 were obtained.

Working Example 8

Except that coating was carried out to a film thickness of 25 μm after desolvation, the method in Working Example 4 was followed, and performance evaluation was carried out to obtain the results shown in Table 5.

Working Example 9

Except that coating was carried out to a film thickness of 20 μm after desolvation, the method in Working Example 4 was followed, and performance evaluation was carried out to obtain the results shown in Table 5.

Working Example 10

10 g of a polyamide acid (v) with γ-butyrolactone (organic solvent) as the solvent, 0.23 g of 3'-hydroxyphenyl acetoanilide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 12. Using the polyamide acid composition 12 obtained, performance evaluation was carried out in the above methods 3-1 to 3-5, and the results shown in Table 5 were obtained.

Working Example 11

10 g of a polyamide acid (vi) with γ-butyrolactone (organic solvent) as the solvent, 0.23 g of 3'-hydroxyphenyl acetoanilide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 13. Using the polyamide acid composition 13 obtained, performance evaluation was carried out in the above methods 3-1 to 3-5, and the results shown in Table 5 were obtained.

Working Example 12

10 g of a polyamide acid (ix) with γ-butyrolactone (organic solvent) as the solvent, 0.26 g of 3'-hydroxyphenyl acetoanilide (0.25 equivalent relative to the carboxyl group of the polyamide acid), 0.027 g of pyromellitic acid, and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 14. Using the polyamide acid composition 14 obtained, performance evaluation was carried out in the above methods 3-1 to 3-5, and the results shown in Table 5 were obtained.

Comparative Example 5

10 g of a polyamide acid (iii) with γ-butyrolactone (organic solvent) as the solvent, 0.30 g of N,N-dimethylacetamide (0.5 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 15. Using the polyamide acid composition 15 obtained, performance evaluation was carried out in the above methods 3-1 to 3-5, and the results shown in Table 5 were obtained.

Comparative Example 6

10 g of a polyamide acid (iii) with γ-butyrolactone (organic solvent) as the solvent, 0.79 g of N,N-dimethylacetamide (1.3 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 16. Using the polyamide acid composition 16 obtained, performance evaluation was carried out in the above methods 3-1 to 3-5, and the results shown in Table 5 were obtained.

Comparative Example 7

10 g of a polyamide acid (iii) with γ-butyrolactone (organic solvent) as the solvent, 0.17 g of N-methylpyrrolidone (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 17. Using the polyamide acid composition 17 obtained, performance evaluation was carried out in the above methods 3-1 to 3-5, and the results shown in Table 5 were obtained.

Comparative Example 8

Except that the desolvation condition was set at 60° C. for 30 minutes on the hot plate and 95° C. for 10 minutes in the drier, performance evaluation was carried under the condition described in Comparative Example 6 to obtain the results shown in Table 5.

TABLE 5

| | Tg-1 (° C.) | Tg-2 (° C.) | Warping | Laminate Yes/No | Dissolution rate (μm/sec) | Film residual rate (%) |
|---|---|---|---|---|---|---|
| Work. Ex. 4 | 80 | 154 | ○ | ○ | 0.33 | 95 |
| Work. Ex. 5 | 80 | 152 | ○ | ○ | 0.33 | 95 |
| Work. Ex. 6 | 83 | 160 | ○ | ○ | 0.35 | 90 |
| Work. Ex. 7 | 73 | 145 | ○ | ○ | 0.34 | 91 |
| Work. Ex. 8 | 80 | 154 | ○ | ○ | (0.33) | 97 |
| Work. Ex. 9 | 80 | 154 | ○ | ○ | (0.35) | 97 |
| Work. Ex. 10 | 63 | 135 | ○ | ○ | 0.31 | 98 |
| Work. Ex. 11 | 78 | 153 | ○ | ○ | 0.30 | 98 |
| Work. Ex. 12 | 80 | 160 | ○ | ○ | 0.34 | 93 |
| Comp. Ex. 5 | 110 | 175 | x | x | 0.16* | 85* |
| Comp. Ex. 6 | 101 | 175 | x | x | 0.21* | 88* |
| Comp. Ex. 7 | 110 | 175 | x | x | 0.17* | 83* |
| Comp. Ex. 8 | 95 | 175 | ○ | ○ | 0.35 | 60 |

Tg-1: Tg after the drying step (° C.)
Tg-2: Tg after 200° C. heating (° C.)
Dissolution rate: A dissolution rate (μm/sec) in the exposed portion
*Value when laminated at 110° C.

3-6: Measurement of the Imidation Rate
3-6-1. Coating

On the gloss surface of the electrolytic copper foil sheet (F3-ws, manufactured by FURUKAWA CIRCUIT FOIL), an alkali-soluble resin was applied to a film thickness of 30 μm after desolvation using an applicator.

3-6-2. Bake

A stepwise heating was carried out at a temperature increase rate of 5° C./min under the condition shown in Table 6.

TABLE 6

| Temperature (° C.) | | | Retention time (min) |
|---|---|---|---|
| | 60 | | 30 |
| | 95 | | 30 |
| | 120 | | 60 |
| | 150 | | 30 |
| 170 | 180 | 200 | 60 |
| | 400 | | 60 |

3-6-3. Calculation of the Imidation Rate

After heating under the condition of 3-6-2, infrared absorption was measured by the ATR method using the Fourier transform infrared spectrometer (FT-IR-460 plus, manufactured by JASCO Corp.). After measurement, the imidation rate was calculated using the following equation (4).

(Imidation rate (%))={$A/B$(measurement temperature)−$A/B$(60° C.)}/{$A/B$(400° C.)−$A/B$(60° C.)}  Equation (4)

A: Imidation-derived peak (about 1375 cm$^{-1}$)

B: Reference peak (about 1480 cm$^{-1}$)

A/B (measurement temperature): Each A/B ratio at 170° C., 180° C., and 200° C.

A/B (60° C.): Each A/B ratio at 60° C.

A/B (400° C.): Each A/B ratio at 400° C.

Working Example 13

10 g of a polyamide acid (i) with γ-butyrolactone (organic solvent) as the solvent, 0.86 g of 4'-hydroxyphenyl acetoanilide (0.7 equivalent relative to the carboxyl group of the polyamide acid), 0.42 g of the quinone diazide compound (10) (20 parts by weight relative to the polyamide acid), and 0.21 g of N-(tert-butoxycarbonyl)-2,6-dimethylpiperidine (10 parts by weight relative to the polyamide acid) were placed in a 50 cc glass bottle, a stirrer was placed thereinto, and stirred to homogeneity in order to obtain a photosensitive polyamide acid composition 18. Using the polyamide acid composition 18 obtained, the imidation rate was calculated in a method described in 3-6. The results are shown in Table 7.

Working Example 14

10 g of a polyamide acid (i) with γ-butyrolactone (organic solvent) as the solvent, 0.86 g of 4'-hydroxyphenyl acetoanilide (0.7 equivalent relative to the carboxyl group of the polyamide acid), and 0.42 g of the quinone diazide compound (10) (20 parts by weight relative to the polyamide acid) were placed in a 50 cc glass bottle, a stirrer was placed thereinto, and stirred to homogeneity in order to obtain a photosensitive polyamide acid composition 19. Using the polyamide acid composition 19 obtained, the imidation rate was calculated in a method described in 3-6. The results are shown in Table 7.

TABLE 7

| | Imidation rate | | |
|---|---|---|---|
| | 170° C. | 180° C. | 200° C. |
| Working Example 13 | 91% | 92% | 100% |
| Working Example 14 | 70% | 80% | 90% |

3-7. Measurement of the Elongation Degree of a Film Obtained by Heating at 200° C.

The photosensitive resin composition was subjected to coating, desolvation, bake, and copper etching under the following condition to prepare a film. Using TENSILON (RTG-1210, manufactured by A & D Company, Limited), the tensile test of the film obtained was carried out.

Coating: A coating stand (manufactured by MATSUKI KAGAKU) on which vacuum adsorption and heating may be carried out had previously been heated at 60° C., and on the coating stand, an electrolytic copper foil sheet (F3-ws, manufactured by FURUKAWA CIRCUIT FOIL) was placed with the gloss surface facing upward. It was then vacuum-adsorbed so as to be stuck on the electrolytic copper foil sheet. On this electrolytic copper foil sheet, using an applicator (manufactured by MATSUKI KAGAKU), a photosensitive resin composition was applied to a film thickness of 30 aim.

Desolvation: After desolvation under the condition of 60° C. for 30 minutes on the above coating stand, desolvation was carried out under the condition of 95° C. for 20 minutes using a drier (SPH-201, manufactured by ESPEC CORP.).

Bake: Using a drier (SPH-201, manufactured by ESPEC CORP.), drying was carried out at a temperature increase rate of 5° C./min in an air atmosphere under the condition shown in Table 8.

TABLE 8

| Temperature (° C.) | Retention time (min) |
|---|---|
| 95 | 10 |
| 120 | 60 |
| 150 | 30 |
| 200 | 60 |

Etching: Etching was carried out using a ferric chloride solution (40 Baume, manufactured by TSURUMI SODA).

Drying: After etching, it was allowed to stand overnight at a temperature of 23° C. and a humidity of 50%.

Working Example 15

Using the photosensitive polyamide acid composition 8 obtained in Working Example 4, the elongation degree of the film after heating at 200° C. was measured by a method in 3-7. The results are shown in Table 9.

Working Example 16

10 g of a polyamide acid (iv) with γ-butyrolactone (organic solvent) as the solvent, 0.23 g of 3'-hydroxyphenyl acetoanilide (0.25 equivalent relative to the carboxyl group of the polyamide acid), and 0.42 g of the quinone diazide compound (II) (20 parts by weight relative to the polyamide acid) were placed in a 50 cc glass bottle, and stirred to homogeneity using a mix rotor (MR-5, manufactured by AS ONE Corp.) in order to obtain a photosensitive polyamide acid composition 20. Using the polyamide acid composition 20 obtained, the elongation degree of the film after heating at 200° C. was measured by a method described in 3-7. The results are shown in Table 9.

Working Example 17

Using the polyamide acid composition 13 obtained in Working Example 11, the elongation degree of the film after heating at 200° C. was measured by a method described in 3-7. The results are shown in Table 9.

TABLE 9

|  | Elongation degree |
| --- | --- |
| Working Example 15 | 6% |
| Working Example 16 | 17% |
| Working Example 17 | 30% |

INDUSTRIAL APPLICABILITY

By using the photosensitive resin composition of the present invention, there can be obtained a photosensitive layer that does not warp, that has a good transferring property, that has a large solubility difference between the exposed portion and the unexposed portion even when a thick film is developed by an aqueous sodium carbonate solution, and that has a film residual rate of the unexposed portion of 90% or more. Also, after exposing (developing) the photosensitive layer, the desired resin pattern can be formed by a low temperature heating treatment at 200° C. or less. Thus, it can be favorably used in dielectric materials, protective film materials, liquid crystal film materials, and optical device materials, specifically in coverlays.

The present invention is based on Patent Application No. 2006-126623 filed on Apr. 28, 2006, and Patent Application No. 2006-205394 filed on Jul. 27, 2006. The contents of them are incorporated herein by reference in its entirety.

The invention claimed is:

1. A photosensitive resin composition comprising at least (A') a polyamide acid represented by formula (8), (B) a dissolution suppressing agent which is at least one selected from 3'-hydroxyphenyl acetanilide, 4'-hydroxyphenyl acetanilide, 4-hydroxyphenyl benzamide, and 3-hydroxyphenyl urea, (C) a photosensitizing agent, and (D) an organic solvent excluding the compound which is identical to the one constituting (B):

[Formula 8]

$$\begin{array}{c} O \quad\quad O \quad H \quad\quad H \\ \| \quad\quad \| \quad | \quad\quad | \\ -C-R_{25}-C-N-R_{26}-N- \\ | \\ (COOH)_2 \end{array} \quad (8)$$

in formula (8), $R_{25}$ represents a tetravalent organic group having two or more carbons, and $R_{26}$ represents a divalent organic group having two or more carbons.

2. The photosensitive resin composition according to claim 1 wherein the imidation rate of a film obtained by heating the photosensitive layer at 200° C. or less is 90% or higher.

3. The photosensitive resin composition according to claim 1 wherein the elongation rate of a film obtained by heating the photosensitive layer at 200° C. or less is 5% or higher.

4. The photosensitive resin composition according to claim 1 wherein $R_{26}$ in formula (8) is $(OR_5)_m-R_4-(COOR_6)_n$ wherein $R_4$ is a 2-4 valent organic group, m+n>0, and $R_5$ and $R_6$ each hydrogen or an organic group having 1-20 carbons, and may be the same or different.

5. The photosensitive resin composition according to claim 1 which comprises a combination of structures in which $R_{25}$ is represented by formula (2) and $R_{26}$ is represented by formula (4), or a combination of structures in which $R_{25}$ is represented by formula (2) and $R_{26}$ is represented by formula (5), or a combination of structures in which $R_{25}$ is represented by formula (3) and $R_{26}$ is represented by formula (5), in formula (8):

[Formula 2]

[Formula 3]

[Formula 4]

[Formula 5]

6. The photosensitive resin composition according to claim 1 wherein (C) a photosensitizing agent is a compound that generates an acid by the irradiation of an active ray.

7. The photosensitive resin composition according to claim 1 wherein (C) a photosensitizing agent is a quinone diazide compound.

8. The photosensitive resin composition according to claim 1 wherein (D) an organic solvent is γ-butyrolactone.

9. The photosensitive resin composition according to claim 1 which further comprises (E) a crosslinking agent.

10. The photosensitive resin composition according claim 9 wherein (E) a crosslinking agent is a tetracarboxylic acid compound, a tetracarboxylic acid ester compound, a polyamide acid compound, or a polyamide acid ester compound represented by formula (6) or formula (7):

[Formula 6]

$$R_{10}OOC \diagdown \diagup COOR_8 \\ R_7 \\ R_{11}OOC \diagup \diagdown COOR_9$$

wherein $R_7$ is a tetra-valent organic group, $R_8$ to $R_{11}$ are hydrogen or an organic group having 1-20 carbons, and may, be the same or different,

[Formula 7]

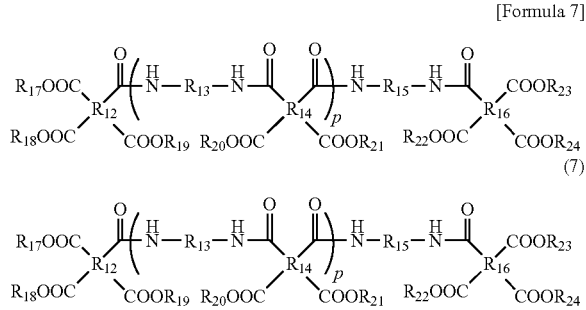

wherein $R_{12}$, $R_{14}$ and $R_{16}$ are each a tetra-valent organic group, and may be the same or different; $R_{13}$ and $R_{15}$ are a divalent to a tetra-valent organic group, and may be the same or different; $R_{17}$ to $R_{24}$ are hydrogen or an organic group having 1-20 carbons, and may be the same or different; and p is an integer of 0 to 100.

11. The photosensitive resin composition according to claim 1 which further comprises (F) a thermal base-generating agent.

12. The photosensitive resin composition according to claim 11 wherein (F) a thermal base-generating agent may generate an amine compound.

13. A photosensitive layer comprising the photosensitive resin composition according to claim 1.

14. A photosensitive film which comprises a carrier film and the photosensitive layer according to claim 13 formed on said carrier film.

15. A laminated film comprising a cover film formed on the above photosensitive layer of the photosensitive film according to claim 14.

16. A method of forming a resin pattern comprising the following steps of:
   an application step which comprises applying the photosensitive resin composition according to claim 1 on the surface of a substrate,
   a photosensitive layer-forming step which comprises forming a photosensitive layer by heating the above photosensitive resin composition after the above application step,
   an active ray-irradiation step which comprises irradiating an active ray on the desired region of the above photosensitive layer after the above photosensitive layer-forming step,
   a resin pattern-forming step which comprises developing the above photosensitive layer using an aqueous alkali solution after the above active ray-irradiation step,
   a washing step which comprises washing the above resin pattern with a rinse solution after the above resin pattern-forming step, and
   a curing step which comprises heating the above resin pattern after the above washing step.

17. A method of forming a resin pattern comprising the following steps of
   an application step which comprises applying the above photosensitive resin composition according to claim 1 on the surface of a substrate,
   a photosensitive layer-forming step which comprises forming a photosensitive layer by heating the above photosensitive resin composition after the above application step,
   a laminating step which comprises transferring the above photosensitive layer on the surface of another substrate after the above photosensitive layer-forming step,
   an active ray-irradiation step which comprises peeling off the substrate used in the above application step from the photosensitive layer after the above laminating step, and then irradiating an active ray on the desired region of the above photosensitive layer,
   a resin pattern-forming step which comprises developing the above photosensitive layer using an aqueous alkali solution after the above active ray-irradiation step,
   a washing step which comprises washing the above resin pattern with a rinse solution after the above resin pattern-forming step, and
   a curing step which comprises heating the above resin pattern after the above washing step.

18. A method of forming a resin pattern comprising the following steps of
   a laminating step which comprises transferring the photosensitive layer of the photosensitive film according to claim 14 on the surface of another substrate,
   an active ray-irradiation step which comprises peeling off the carrier film of the above photosensitive film after the above laminating step, and then irradiating an active ray on the desired region of the above photosensitive layer,
   a resin pattern-forming step which comprises developing the above photosensitive layer using an aqueous alkali solution after the above active ray-irradiation step,
   a washing step which comprises washing the above resin pattern with a rinse solution after the above resin pattern-forming step, and
   a curing step which comprises heating the above resin pattern after the above washing step.

19. A method of forming a resin pattern comprising the following steps of:
   a laminating step which comprises peeling off one of the cover film or the carrier film of the laminated film according to claim 15, and then transferring the photosensitive layer on the surface of another substiate,
   an active ray-irradiation step which comprises peeling off the other of the cover film or the carrier film of the above photosensitive film after the above laminating step, and then irradiating an active ray on the desired region of the above photosensitive layer,
   a resin pattern-forming step which comprises developing the above photosensitive layer using an aqueous alkali solution after the above active ray-irradiation step,
   a washing step which comprises washing the above resin pattern with a rinse solution after the above resin pattern-forming step, and
   a curing step which comprises heating the above resin pattern after the above washing step.

20. A coverlay formed by a method according to any one of claims 16-19.

21. A circuit board comprising the coverlay according to claim 20.

* * * * *